United States Patent [19]

Crowder et al.

[11] 3,922,708

[45] Nov. 25, 1975

[54] METHOD OF PRODUCING HIGH VALUE ION IMPLANTED RESISTORS

[75] Inventors: Billy L. Crowder, Putnam Valley; Swie-In Tan, Bedford Hills, both of N.Y.

[73] Assignee: International Business Machines Corporation, Armonk, N.Y.

[22] Filed: Mar. 4, 1974

[21] Appl. No.: 448,100

[52] U.S. Cl. ........................ 357/51; 357/28; 357/91

[51] Int. Cl.$^2$ ........................ H01L 27/02

[58] Field of Search .................... 357/28, 49, 91, 51

[56] References Cited

UNITED STATES PATENTS

| | | | |
|---|---|---|---|
| 3,390,012 | 6/1968 | Haberecht | 357/49 |
| 3,614,480 | 10/1971 | Berglund | 357/28 |
| 3,620,945 | 11/1971 | Sivertsen | 357/91 |
| 3,682,700 | 8/1972 | Glyptis | 357/91 |
| 3,693,011 | 9/1972 | Devaux et al. | 357/91 |
| 3,705,060 | 12/1972 | Stork | 357/91 |

*Primary Examiner*—Andrew J. James
*Attorney, Agent, or Firm*—George Baron

[57] ABSTRACT

High value resistors, of the order of $10^9$ ohms/square and higher, are fabricated by implanting zinc or lead ions into a silicon dioxide layer over a silicon chip containing electrical components and/or circuits.

6 Claims, 2 Drawing Figures

METHOD OF PRODUCING HIGH VALUE ION IMPLANTED RESISTORS

BACKGROUND OF THE INVENTION

Most, if not all, methods of making resistors on silicon wafers or chips include the deposition or implantation of ions onto the surface of the silicon. Since silicon is a semiconductor, the resistivities achievable are limited, i.e., values of $10^4$ ohms/square are deemed high. Moreover, the resistors so manufactured reside on the silicon chip or wafer and thus use up valuable real estate that could be employed for housing other components and/or circuitry.

When silicon wafers, containing the desired electrical components, are readied for use in larger circuitry, they are covered with a passivating or protective insulating layer such as silicon dioxide ($SiO_2$), silicon nitride ($Si_3N_4$), aluminum oxide ($Al_2O_3$), or the like. Such passivating layer is of the order of 1000 to 10,000 A thick. In order to connect a plurality of such wafers to one another, holes or vias are cut through the passivating layer so that electrical contacts can be made to the components on the surface of the silicon.

The present invention, realizing that a passivating layer for a silicon chip must be used and also that vias must be cut through such passivating layer to complete electrical circuitry from one chip to another, employs the passivating layer in a dual role. The silicon dioxide or its equivalent insulator that passivates the circuitry on a chip is implanted with metal ions so that resistors are formed within the body of the insulator. Not only does the location of such resistors save real estate on the chip or wafer that will include such resistors in their electrical circuitry, but resistors can be made to have values of $10^9$ ohms/square. Since silicon is a semiconductor and is slightly electrically conductive, it is impossible to obtain such high value resistors in the body of the semiconductor. Thus, this invention accomplishes two very highly desirable objects, namely, the saving of real estate and the ability to not only fabricate resistors whose values are comparable to those obtained in semiconductors, but resistors having values not obtainable in semiconductors. The invention achieves a great degree of flexibility in the making of integrated circuits.

Figure 1A:
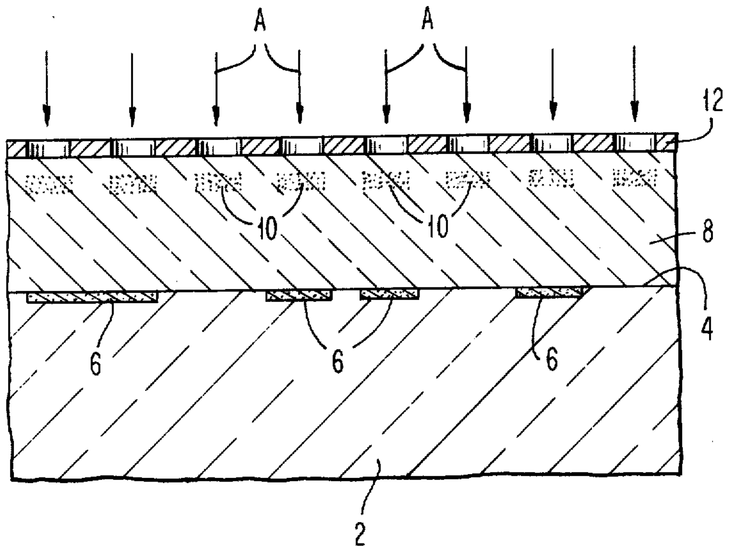
FIG. 1 is a schematic showing of the bombardment of a $SiO_2$ layer with metal ions to produce resistors in the body of the $SiO_2$ layer.

In the normal fabrication of integrated circuitry, one begins with a semiconductor, i.e., silicon, wafer 2, chip or substrate onto or into whose top surface 4 are deposited electrical components 6. Such electrical components may be manufactured by diffusion, ion implantation, sputtering, electroless or electrolytic deposition, vapor deposition, etc. The manner in which deposition takes place is immaterial to the present invention. It is also part of the prior art fabrication procedure to insulate the circuitry 6 in the surface 4 of the semiconductor 2, and a thin layer 8 of silicon dioxide, of the order of a 1000 A – 10,000 A, is deposited over such circuitry.

Figure 1B:
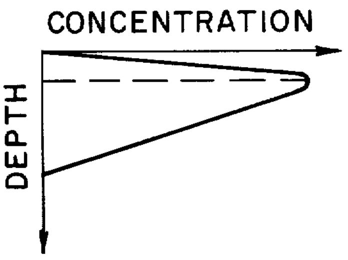

The present invention creates a passive element such as a resistor 10, or a plurality of resistors, in the body of insulator 8 by the implantation, represented by arrows A, of metal ions. Zinc and lead are representative metals whose ions can be implanted into the insulator 8. During implantation, a mask 12 of an ion absorbing material, i.e., aluminum, covers those regions of the silicon dioxide 8 which are not to be exposed to metal ions. The ion profile is shown graphically to the right of FIG. 1 wherein a plot of concentration versus depth is plotted. It is seen that the peak concentration is beneath the surface of the insulator 8 so that the latter serves as a passivating layer protecting the resistor(s) 10 within that layer and provides excellent electrical isolation between a resistor 10 and the silicon substrate 8.

Data was obtained to show range parameters for zinc ion implantations into various insulators and Table 1 summarizes the data.

TABLE I

RANGE PARAMETERS FOR Zn ION IMPLANTED INTO INSULATORS

| Insulator | Energy of Zn Ion (KeV) | Projected Range $R_p$(A) |
|---|---|---|
| $SiO_2$ | 140 | 1100 |
| | 280 | 2200 |
| $Si_3N_4$ | 280 | 1410 |
| $Al_2O_3$ | 260 | 1200 |

The insulators 8 chosen were $SiO_2$, $Si_3N_4$ or $Al_2O_3$. The energy of the zinc ion, measured in KeV, was 140 and 280, and the ions penetrated into $SiO_2$, respectively, to depths of 1100 and 2200 A. When using $Si_3N_4$ as the insulator 10, a 280 KeV beam of zinc ions penetrated only 1400 A into the insulator, and when $Al_2O_3$ was the insulator 10 a beam of zinc ions having an energy of 260 KeV will result in a penetration of 1200 A into the $Al_2O_3$. In general, for an insulator 10 of thickness of 1000 A – 10,000 A, the ion species implanted would have an energy of 20 to $300^+$KeV.

Table 2 sets forth the resistivity of the ion implantations in $SiO_2$ using a constant energy of 100 KeV for the ion beam, measurements of resistivity being made before annealing the $SiO_2$.

TABLE 2

RESISTIVITY BEFORE ANNEALING OF $SiO_2$ IMPLANTED WITH 100 KeV Zn IONS

| Zn Ions $cm^{-2}$ | Resistivity before Annealing |
|---|---|
| $1\times10^{15}$ | Greater than $10^{12}$ ohms/square |
| $1\times10^{16}$ | Greater than $10^{12}$ ohms/square |
| $5\times10^{16}$ | $1.2\times10^9$ ohms/square |
| $11\times10^{16}$ | $.8\times10^9$ ohms/square |

The left side of Table 2 sets out the number of zinc ions per cm. being implanted at an energy of 100 KeV and the right side of Table 2 sets out the corresponding resistivity of the implanted resistor. Thus, for a range of ion concentration of $10^{15}$ ions/$cm^2$ to $11\times10^{16}$ ions/$cm^2$, the resistivity varies from $10^{12}$ ohms/square to $0.8\times10^9$ ohms/square. It was also ascertained that damage along of the silicon dioxide by ion implantation did not result in appreciable conductivity change in resistivity. Implantations greater than $10^{17}$ silicon ions/$cm^2$ produced no measurable change in the electrical characteristics of the implanted region.

Figure 2:
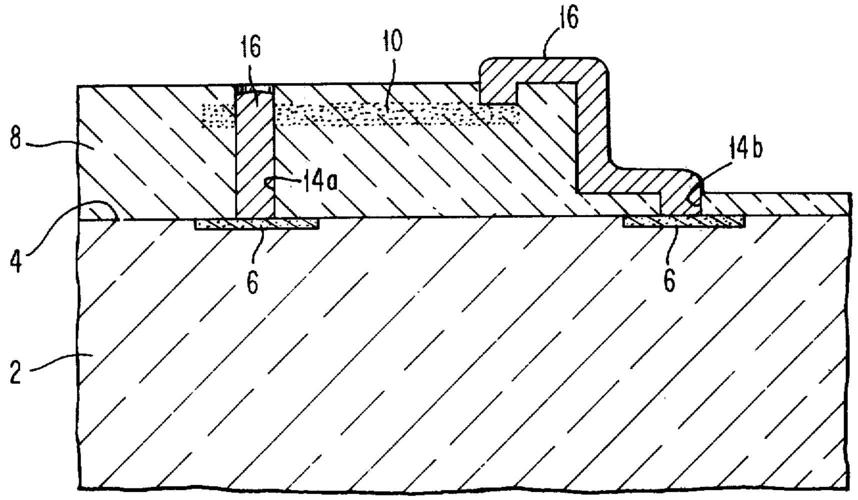
FIG. 2 is a showing of how electrical connections are made between the circuits on the silicon wafer and the resistors within the insulating overlayer.

FIG. 2 illustrates two possible methods of providing electrical connection between the implanted resistor 10 with electrical circuitry 6 in or on the top surface 4 of the semiconductor 2. There are many ways to provide such electrical connection and such ways do not form any part of the invention, but merely serve to implement the invention. Regions of the silicon dioxide 8 are etched to produce vias 14*a* or holes 14*b* that contain conductive material 16. The conductive material serves to connect an implanted resistor 10 with the electrical circuitry 6 on the top surface 4 of the semiconductor 2, electrical contact being made within the body of the silicon dioxide layer as illustrated in 14*a* or to the top surface of the silicon dioxide layer as illustrated in 14*b*. Thus, the silicon dioxide 8 can be bombarded with conductive material perpendicularly to its surface to produce not only vias but conducting paths; or one can produce holes 14 by electron beams, chemical or physical etching, etc., and then metallize these holes with silver, gold, copper and the like using vapor deposition, electroless or electrolytic deposition, etc.

It was also ascertained that any electrical contacts, such as contact 16, that were evaporated to make contact to the resistor 10 showed a resistance of the order of 5% of the implanted resistor value, but after annealing the semiconductor to 450°–500° C for about 30 minutes, the contact resistance dropped to a value that was, for all practical purposes, zero as compared to that of the implanted resistor.

Table 3 sets out the effect of annealing of the semiconductor after a resistor 10 has been implanted into the insulator 8.

TABLE 3

EFFECT OF ANNEALING ON ION IMPLANTED RESISTORS ($1\times10^{17}$ cm$^{-2}$ Zn (100 KeV) into $SiO_2$)

| ANNEALING | RESISTIVITY |
|---|---|
| No anneal | $8\times10^{8}$ ohms/square |
| 450–500° C, 20 minutes | $3.2\times10^{7}$ ohms/square |
| 450–500° C, 80 minutes | $2.3\times10^{7}$ ohms/square |

It is seen that annealing, while it reduces the resistivity by one order as compared to the absence of annealing, does not interfere with the attainment of a high resistivity. Another flexible feature of the invention is the fact that ion implanted resistors can be "erased." By heating the silicon wafer 2 and its accompanying insulator of $SiO_2$ 8° to 900° C for 30 minutes, the conductivity of the implanted resistor 10 vanishes. This is believed due to the diffusion of the implanted metal, i.e., zinc, to the surface of the $SiO_2$ and evaporation therefrom. However, no such diffusion of zinc at 900° C took place when the insulator was $Si_3N_4$, so that implanted resistors can be fabricated that are extremely stable even at high temperatures.

The resistors produced in accordance with the teachings of this invention had a linearity that was maintained up to about 35 volts and the temperature coefficient of resistance was negative and approximately $10^{-3}$/°C between room temperature and 100° C.

The present invention provides very high resistors in an integrated circuit using a procedure that is highly compatible with semiconductor wafers supporting thin film circuitry. Not only does it permit the attainment of high resistivities not attainable in semiconductors, but the invention is flexible enough to permit the making of low valued resistors if desired. Very importantly, not only is valuable real estate on a semiconductor wafer saved, but the very insulating layer 8 that must be used to passivate the integrated circuitry serves another role of creating high valued resistors.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor wafer having a network of electrical circuitry on its surface, an insulating layer over said surface, resistive elements imbedded by ion implantation within the body of said insulating layer, said elements having resistivities of $10^7$ to $10^9$ ohms/square, and means in said insulating layer for allowing electrical connection between said electrical circuitry and said resistive elements.

2. The device of claim 1 wherein said semiconductor wafer is silicon.

3. The device of claim 2 wherein said insulating layer is silicon dioxide.

4. The device of claim 1 wherein said imbedded resistances consist of implanted ions of zinc.

5. The device of claim 1 wherein said imbedded resistance consists of implanted ions of lead.

6. The device of claim 1 wherein said imbedded resistor has a small temperature coefficient of resistivity.

* * * * *